(12) United States Patent
Pang

(10) Patent No.: US 7,777,412 B2
(45) Date of Patent: Aug. 17, 2010

(54) PHOSPHOR CONVERTED LED WITH IMPROVED UNIFORMITY AND HAVING LOWER PHOSPHOR REQUIREMENTS

(75) Inventor: Siew It Pang, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 477 days.

(21) Appl. No.: 11/690,041

(22) Filed: Mar. 22, 2007

(65) Prior Publication Data

US 2008/0231181 A1 Sep. 25, 2008

(51) Int. Cl.
*H01L 33/00* (2010.01)
(52) U.S. Cl. ............... 313/506; 313/501; 313/512
(58) Field of Classification Search ........... 313/501, 313/506, 512; 257/98, 99, 100, 103
See application file for complete search history.

(56) References Cited

U.S. PATENT DOCUMENTS 6,674,097 B2 * 1/2004 Komoto et al. ............ 257/98
6,917,057 B2 * 7/2005 Stokes et al. ............. 257/98
7,005,679 B2 * 2/2006 Tarsa et al. ............... 257/89
7,498,734 B2 * 3/2009 Suehiro et al. ........... 313/502
2006/0126326 A1 * 6/2006 Ng et al. .................. 362/231

* cited by examiner

*Primary Examiner*—Nimeshkumar D. Patel
*Assistant Examiner*—Anthony T Perry

(57) ABSTRACT

A light source having a first die with an LED thereon, a substrate, a base layer and a first phosphor layer is disclosed. The first die is characterized by a top surface, a bottom surface and a light generation region at a height above the bottom surface. The substrate includes a depression in which the first die is mounted. The base layer fills the depression in the substrate to a height greater than half the distance from the bottom surface of the first die to the top surface of the first die and less than the light generation height of the first die. The first phosphor layer includes a first light converting material that converts light emitted by the first die to light of a different wavelength. The first phosphor layer is in direct contact with the base layer and covers the first die.

8 Claims, 3 Drawing Sheets

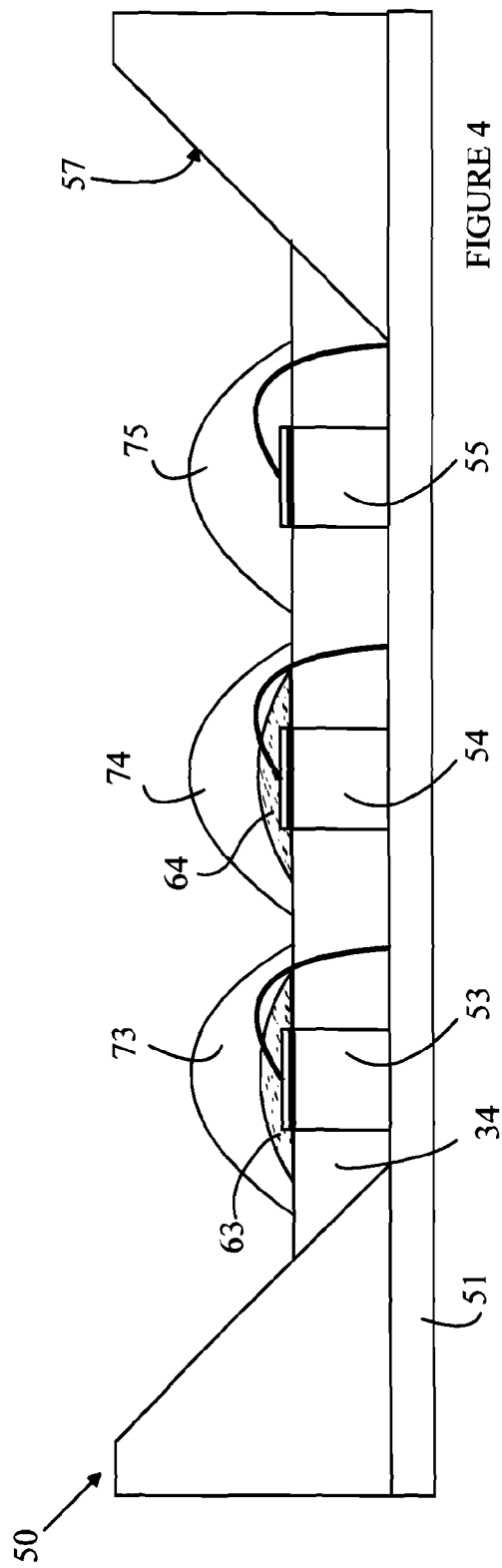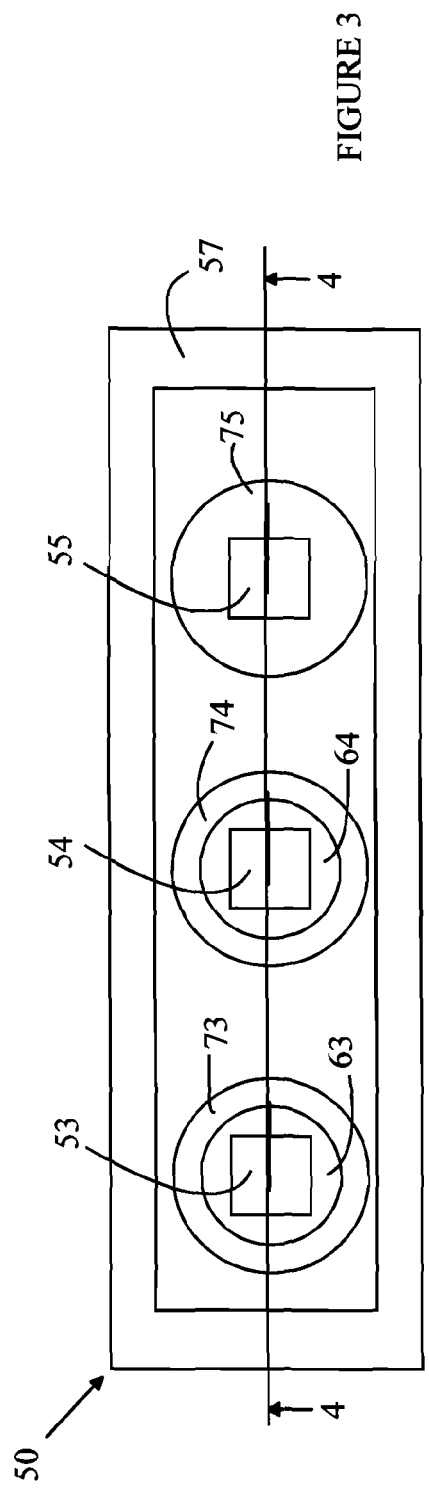

PHOSPHOR CONVERTED LED WITH IMPROVED UNIFORMITY AND HAVING LOWER PHOSPHOR REQUIREMENTS

BACKGROUND OF THE INVENTION

Light emitting diodes (LEDs) are attractive candidates for replacing conventional light sources such as incandescent lamps and fluorescent light sources. LEDs have higher light conversion efficiencies than incandescent lamps and longer lifetimes than both types of conventional sources. In addition, some types of LEDs now have higher conversion efficiencies than fluorescent light sources, and still higher conversion efficiencies have been demonstrated in the laboratory.

Unfortunately, LEDs produce light in a relatively narrow spectral band. Hence, to produce a light source having an arbitrary color, a compound light source having multiple LEDs is often utilized. For example, an LED-based light source that provides an emission that is perceived as matching a particular color can be constructed by combining light from red, green, and blue emitting LEDs. The ratio of the intensities of the various colors sets the color of the light as perceived by a human observer.

To replace conventional lighting systems, LED-based sources that generate light that appears to be "white" to a human observer are required. A light source that appears to be white and that has a conversion efficiency comparable to that of fluorescent light sources can be constructed from a blue LED that is covered with a layer of phosphor that converts a portion of the blue light to yellow light. Such light sources will be referred to as "phosphor converted" light sources in the following discussion. If the ratio of blue to yellow light is chosen correctly, the resultant light source appears white to a human observer.

Unfortunately, the uniformity of such phosphor converted light sources presents problems, particularly when two white LEDs are used to illuminate displays that are viewed simultaneously by an observer. Not all white light sources appear the same. For example, incandescent lights emit a spectrum that is approximated by a black body heated to a "color temperature". If the lights are operated such that the color temperature is high, the white light appears more bluish. If the color temperature is low, the light appears to be more reddish and is perceived to be "warmer" than the higher color temperature light.

White LEDs also vary in their effective color temperature depending on the specific phosphor used to convert the blue light and the amount of phosphor that covers the LED. If too little phosphor covers the LED, the light source appears bluish, since a greater quantity of blue light will escape the LED without being converted. Similarly, if the phosphor layer is too thick, the light source will appear yellowish, since too much of the blue light will have been converted.

The amount of phosphor that overlies the LED die and the manner in which that phosphor is illuminated can vary significantly during the manufacturing process from batch to batch as well as between light sources fabricated in the same batch. As a result, individual LEDs can vary significantly in their effective "color temperature". If two LEDs that differ significantly from one another are used to illuminate displays that are viewed simultaneously by a human observer, the differences in the emitted spectra are often objectionable to the observer.

SUMMARY OF THE INVENTION

The present invention includes a light source having a first die with an LED thereon, a substrate, a base layer and a first phosphor layer. The first die is characterized by a top surface, a bottom surface and a light generation region at a height above the bottom surface. The substrate includes a depression in which the first die is mounted by attaching the bottom surface of the first die to a bottom surface in the depression. The base layer fills the depression in the substrate to a height greater than half the distance from the bottom surface of the first die to the top surface of the first die and less than the light generation height of the first die. The first phosphor layer includes a first light converting material that converts light emitted by the first die to light of a different wavelength. The first phosphor layer is in direct contact with the base layer and covers the first die. In one aspect of the invention, the base layer is transparent to light generated by the first die and the first phosphor layer. In another aspect of the invention, the light source further includes a first layer of transparent material overlying the phosphor layer. In a third aspect of the invention, the light source further includes a second die having an LED thereon, characterized by a top surface, a bottom surface and a light generation region at a height above the bottom surface, and a second phosphor layer, in direct contact with the base layer and covering the second die. In this third aspect of the invention, the second phosphor layer includes a second light converting material that converts light generated by the second die to light of a different wavelength, and the second light converting material is different from the first light converting material.

BRIEF DESCRIPTION OF THE DRAWINGS

FIG. 3 is a top view of another embodiment of a light source according to the present invention.

FIG. 4 is a cross-sectional view of another embodiment of a light source according to the present invention.

DETAILED DESCRIPTION OF THE PREFERRED EMBODIMENTS OF THE INVENTION

Figure 1:
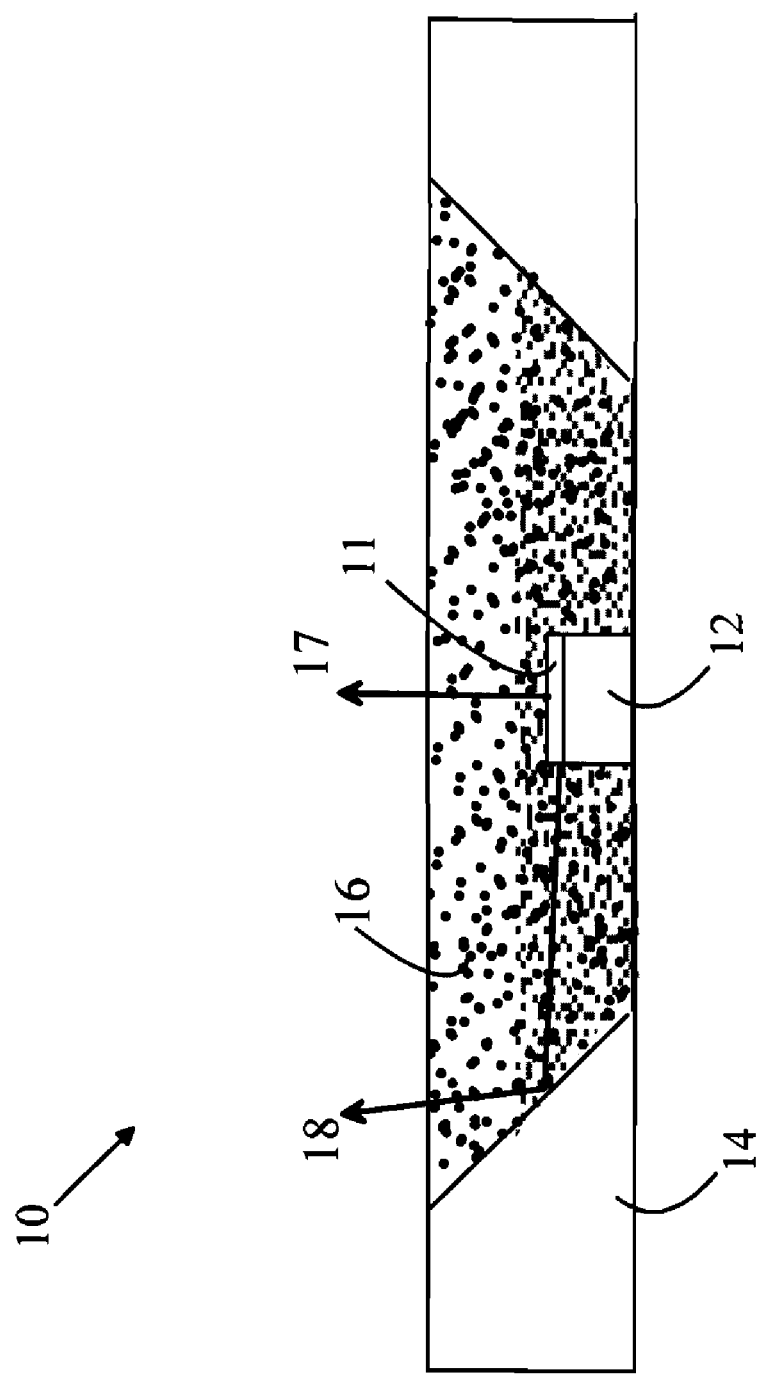
FIG. 1 is a cross-sectional view of a prior art white light LED.

FIG. 1 shows a typical prior art arrangement for a phosphor converted LED source 10 of a type that is currently in general use. A light emitting semiconductor die 12 is mounted within a cavity on a substrate 14. The die includes a light generating layer 11 that is near the top of the die. The LED includes an active layer that generates light when holes and electrons recombine in the active layer. Light from the active region that does not strike the top surface of the LED at an angle less than the critical angle, is trapped within the LED and exits the LED from the sides of the LED. The trapped light is concentrated in a horizontal layer that is defined by the top surface of the LED and a layer within the LED structure that has an index of refraction that is greater than that of the underlying layers of the LED. In some LED structures the bottom boundary is the substrate on which the LED layers are fabricated. In other LEDs, the bottom layer is a layer between the active region and the substrate. The light generation height corresponding to the LED is defined to be the distance from the bottom of the die to the layer that defines the bottom of the light generation layer.

The region below light generating layer 11 is primarily a pedestal that provides only a small fraction of the light that leaves the light source. Hence, phosphor particles below the light generating region are of little value in converting the light generated by the LED. In addition, light leaving the side of the LED traverses a significantly longer path through the phosphor than light emitted from the top surface of the LED. As noted above, part of the light from the die is converted by a phosphor to light of another color such that the combination of the converted and unconverted light is perceived to be the desired color. The perceived color is a sensitive function of the amount of phosphor through which the light from die 12 must pass. Hence, if the cup diameter is significantly larger than the phosphor layer, the side-emitted light will have a higher concentration of the converted wavelengths than light leaving the top surface of the LED.

The phosphor layer is typically fabricated by mixing particles of a phosphor material into a transparent carrier, typically an epoxy or silicone based compound. The resulting material 16 is applied over the die in the cavity to partially or entirely fill that cavity. Heat and/or UV light is then applied to cure the carrier, and hence, provide a semi-transparent phosphor layer.

As noted above, blue light emitted from the die passes into the phosphor mixture, some of the light being converted from blue to yellow, and the resulting mixture of wavelengths leaves the device. The light either leaves directly, as for example ray 17, or after reflection from the side walls of the cavity, as for example ray 18. The mixture of blue and yellow wavelengths gives rise to a perception of a white color when viewed by a human observer. The degree of blueness or yellowness depends on the phosphor concentration distribution encountered by light emerging from different points over the area of the source.

Unfortunately, the phosphor concentration varies from device to device. The amount of phosphor in the region above layer 11 is a sensitive function of the time between the application of the carrier and the time the carrier is sufficiently cured to prevent settling of the particles. In general, the phosphor particles have a density that is substantially greater than that of the carrier. Hence, until the epoxy cure is complete, the phosphor particles tend to settle under the influence of gravity, forming a vertical concentration gradient. The amount of phosphor that is above layer 11 is a function of the amount of phosphor that settled prior to curing. Hence, small differences in the curing times lead to differences in the amount of phosphor through which the blue light passes.

The present invention is based on the observation that the problems associated with variations in the concentration gradient above the light generation layer are the result of variations in the amount of phosphor above the light generation layer. Hence, if the amount of phosphor above the light generation layer can be held constant, variations in the concentration gradient due to differences in settling times from light source to light source are less critical.

Figure 2:
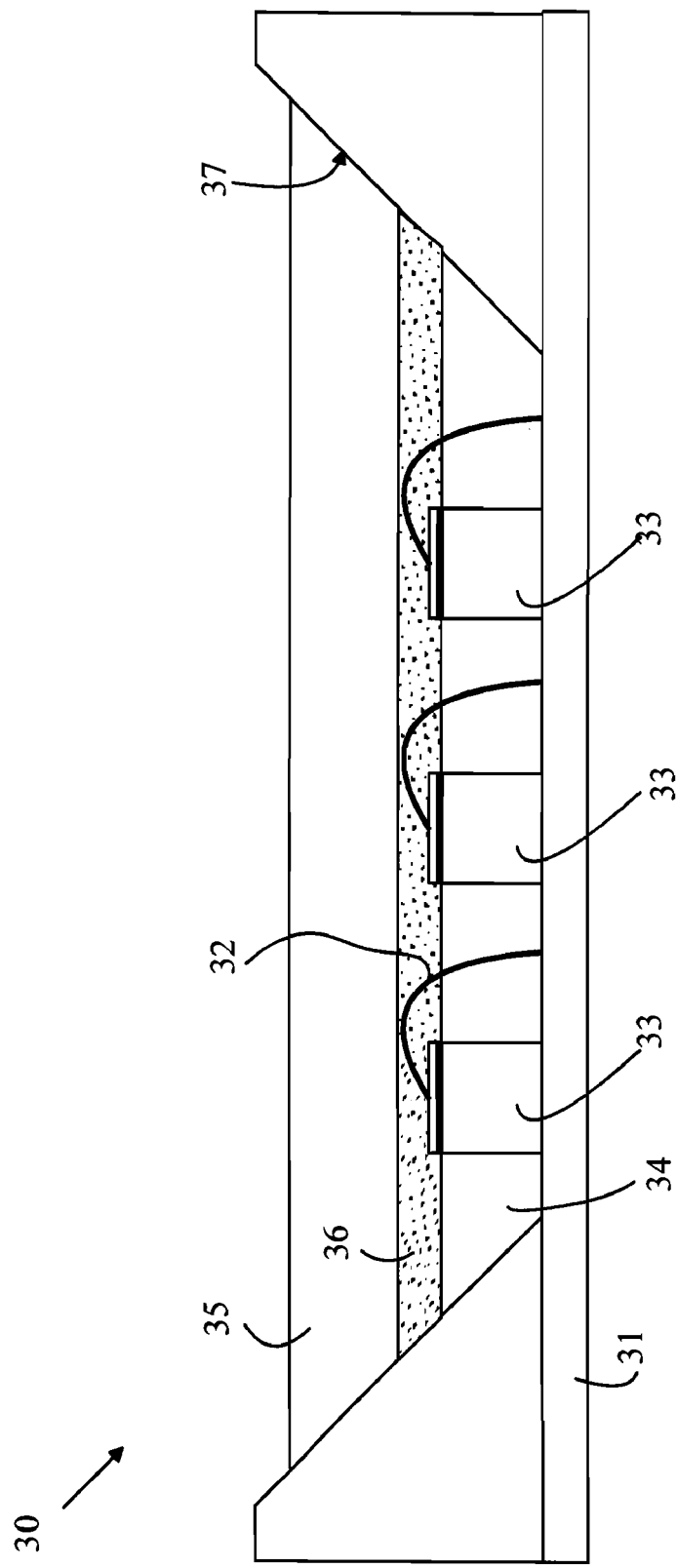
FIG. 2 is a cross-sectional view of one embodiment of a light source according to the present invention.

Refer now to FIG. 2, which is a cross-sectional view of one embodiment of a light source according to the present invention. Light source 30 is constructed on a substrate 31 on which a plurality of dies 33 having LEDs thereon are mounted. Substrate 31 includes a plurality of traces that are used to power the various LEDs. It is assumed that the dies have one power contact on the bottom surface of each die and one contact on the top surface of each die. The bottom contact is bonded to a corresponding connection pad on substrate 31. The top contact is connected to a corresponding trace on substrate 31 by a wire bond such as wire bond 32. To simplify the drawings, the various traces and connection pads have been omitted from the drawings. The LEDs are mounted in a cup 37 that has reflective sides to redirect light striking the sides of cup 37 to the forward direction.

Part of the light from the LEDs is converted by a layer 36 of phosphor particles. Layer 36 is constructed on a clear layer 34 that fills the bottom of cup 37 such that the top surface of layer 34 is at, or just below, the light generating layer in the dies. However, the advantages of the present invention can be partially achieved by using a clear layer that extends to a height somewhat below the height of the light generation region. In one embodiment, the clear layer extends from the bottom of the cup to a height that is greater than one half of the die height. The phosphor layer is introduced after the clear layer has been applied and set. Phosphor layer 36 is constructed by mixing the phosphor particles with a clear carrier such as an epoxy or silicone and applying a layer of the carrier to the light source. The layer is then cured using light or heat. Hence, the phosphor particles in layer 36 are prevented from settling below the light generation layer of the LEDs.

An additional clear layer 35 can be provided over phosphor layer 36. Layer 35 can provide protection of the phosphor from moisture. In addition, layer 35 could include other useful materials such as particles for diffusing the light that leaves layer 36. In this regard, it should be noted that the light that is not converted by the phosphor particles may appear to originate from a different light source than the phosphor converted light if the density of phosphor particles is not sufficient to scatter the blue light that is not converted. Including a diffusant in layer 35 increases the homogeneity of the light such that both the blue and yellow light appears to originate from a uniform extended light source.

In addition, the use of a diffusant together with a reflective surface on the top surface of substrate 31 within the cup improves the light extraction from light source 30. The difference in index of refraction between the air over layer 35 and the material from which layer 35 is constructed can result in a significant fraction of the light generated within the light source being trapped by internal reflection. This light is scattered by the diffusant particles and strikes the surface at a new angle of incidence. Some fraction of the light that is returned to the top surface is able to escape on the second pass. The remaining light is then re-oriented by subsequent scatterings and reflections from the surfaces of cup 37 or substrate 31.

The diffusant function could also be provided by roughening the top surface of layer 35 rather than, or in addition to, providing diffusant particles within the medium. If the top surface of layer 35 extends to the top of the cup, the surface can be roughened by polishing with an abrasive agent. In this regard, it should be noted that the light sources are normally constructed in a sheet having a common substrate on which the cups are fabricated or mounted as a single sheet covering the sheet of substrate 31. After fabrication, the sheet is divided into the individual light sources by cutting the sheet. Hence, the top surface of all of the light sources on a sheet could be roughed at the same time by abrasive polishing with a pad that is large compared to the individual light sources.

It should be noted that clear layer 34 prevents the phosphor particles from settling below the light emitting layer of the LEDs. Since substantially all of the phosphor particles are above the dies in this arrangement, differences in the degree of settling of the particles from device to device only change the distribution of particles above the dies, not the amount of phosphor that the light from the LEDs must traverse. Since it is the amount of phosphor that determines the ratio of the yellow to blue light in the light leaving the light source, the present invention provides better uniformity than the prior art methods.

It should also be noted that the amount of phosphor needed to construct a light source according to the present invention is significantly less than that used in the prior art light sources shown in FIG. 1. The phosphors used to convert the light represent a significant fraction of the material costs for a light source such as that shown in FIG. 1. Since the phosphor materials are significantly more expensive than the clear medium used to fill the bottom portion of the reflective cup, the present invention is also significantly less expensive than the prior art light sources.

The above-described embodiments utilize a layer of phosphor having a constant thickness over the clear base layer. However, other configurations can be utilized. Refer now to FIGS. 3 and 4, which illustrate another embodiment of a light source according to the present invention. FIG. 3 is a top view of light source 50, and FIG. 4 is a cross-sectional view of light source 50 through line 4-4 shown in FIG. 3.

Light source 50 includes three LED dies 53-55 in a single cup 57. The dies are connected to traces in a substrate 51 in a manner analogous to that discussed above. The traces in substrate 51 have been omitted from the drawing to simplify the drawing.

Dies 53 and 54 utilize phosphor conversion layers 63 and 64, respectively. Die 55 does not include a phosphor conversion layer. The phosphor conversion layers are limited to the dies corresponding to those layers. Hence, each die could utilize a different phosphor. The amount of phosphor utilized is even less than in the case of the embodiments discussed above with reference to FIG. 2.

Each die is also covered by a clear dome-shaped layer of encapsulant. The dome-shaped layers corresponding to dies 53-55 are shown at 73-75, respectively. The dome-shaped layers improve the light extraction efficiency from the dies by providing a surface in which a greater fraction of the light leaving the dies, or the phosphor conversion layers, strikes the air-encapsulant boundary of each layer at angles greater than the critical angle than would be the case if the clear layer had a planar surface as shown in FIG. 2.

It should be noted that the amount of phosphor through which the light generated in dies 53 and 54 pass as a function of the direction of emission of that light is more nearly constant in the arrangement shown in FIGS. 3 and 4 than in the prior art devices. As a result, the light from each of the LEDs appears more constant in color as a function of viewing angle than the light generated by the prior art designs shown in FIG. 1.

The above-described embodiments of the present invention include a base layer that is constructed from a clear material. However, embodiments that use an opaque material could also be constructed. For example, a base layer that is constructed from a reflective material could provide a reflective surface without relying on a reflective substrate. Such a layer could be constructed by adding white particles such as $TiO_2$ to the clear medium.

Various modifications to the present invention will become apparent to those skilled in the art from the foregoing description and accompanying drawings. Accordingly, the present invention is to be limited solely by the scope of the following claims.

What is claimed is:

1. A light source comprising:
   a first die having an LED thereon, said first die being characterized by a light generation height, a top surface, a bottom surface and a light generation region at said light generation height above said bottom surface;
   a substrate including a depression in which said die is mounted by attaching said bottom surface to a bottom surface in said depression;
   an opaque base layer that fills said depression to a height greater than half the distance from said bottom surface to said top surface of said first die and less than said light generation height; and
   a first phosphor layer in direct contact with said base layer and covering said first die, said first phosphor layer comprising a first light converting material that converts light emitted by said first die to light of a different wavelength.

2. The light source of claim 1 further comprising a first layer of transparent material overlying said first phosphor layer.

3. The light source of claim 2 further comprising:
   a second die having an LED thereon, said second die being characterized by a light generation height, a top surface, a bottom surface and a light generation region at said light generation height above said bottom surface, said second die being attached to said bottom surface in said depression;
   a second phosphor layer in direct contact with said base layer and covering said second die, said second phosphor layer comprising a second light converting material that converts light generated by said second die to light of a different wavelength, said second light converting material being different from said first light converting material.

4. The light source of claim 3 further comprising a second layer of transparent material overlying said second phosphor layer, said second layer of transparent material being separated from said first layer of transparent material.

5. The light source of claim 2 wherein said first layer of transparent material comprises a dome-shaped outer surface.

6. The light source of claim 1 wherein said first phosphor layer comprises particles of said first light converting material in a clear medium.

7. A light source comprising:
   a first die having an LED thereon, said first die being characterized by a light generation height, a top surface, a bottom surface and a light generation region at said light generation height above said bottom surface;
   a substrate including a depression in which said die is mounted by attaching said bottom surface to a bottom surface in said depression;
   an opaque base layer that fills said depression to a height greater than half the distance from said bottom surface to said top surface of said first die and less than said light generation height; and
   a first phosphor layer in direct contact with said base layer and covering said first die, said first phosphor layer comprising a first light converting material that converts light emitted by said first die to light of a different wavelength;
   a first layer of transparent material overlying said first phosphor layer;
   a second die having an LED thereon, said second die being characterized by a light generation height, a top surface, a bottom surface and a light generation region at said light generation height above said bottom surface, said second die being attached to said bottom surface in said depression;
   a second phosphor layer in direct contact with said base layer and covering said second die, said second phosphor layer comprising a second light converting material that converts light generated by said second die to light of a different wavelength, said second light converting material being different from said first light converting material;

a second layer of transparent material overlying said second phosphor layer, said second layer of transparent material being separated from said first layer of transparent material;

a third die having an LED thereon, said third die being characterized by a light generation height, a top surface, a bottom surface and a light generation region at said light generation height above said bottom surface, said third die being attached to said bottom surface in said depression, wherein no phosphor layer overlies said third die;

a third layer of transparent material in direct contact with said base layer and said third die and covering said third die, said third layer of transparent material being separated from said first and second layers of transparent material;

wherein each of said first, second and third layers of transparent material are dome shaped.

8. The light source of claim 7 wherein each of said first and second phosphor layers are dome shaped.

* * * * *